United States Patent [19]
Campbell, Jr. et al.

[11] Patent Number: 5,281,867
[45] Date of Patent: Jan. 25, 1994

[54] MULTIPLE CHANNEL SAMPLING CIRCUIT HAVING MINIMIZED CROSSTALK INTERFERENCE

[75] Inventors: Jules D. Campbell, Jr.; Kelvin E. McCollough, both of Austin, Tex.

[73] Assignee: Motorola, Inc., Schaumburg, Ill.

[21] Appl. No.: 21,693

[22] Filed: Feb. 23, 1993

[51] Int. Cl.$^5$ .................. H03K 5/159; H03K 17/56
[52] U.S. Cl. .................................. 307/353; 307/246; 328/151
[58] Field of Search ............... 307/353, 246; 328/151

[56] References Cited

U.S. PATENT DOCUMENTS

| | | | |
|---|---|---|---|
| 3,135,874 | 6/1964 | Lucas et al. | 307/88.5 |
| 4,223,235 | 9/1980 | Rufray | 307/241 |
| 4,823,027 | 4/1989 | Takahashi | 328/151 |
| 5,081,454 | 1/1992 | Campbell, Jr. et al. | 341/141 |
| 5,099,239 | 3/1992 | Bruce et al. | 341/155 |
| 5,196,733 | 3/1993 | Shin | 307/243 |

FOREIGN PATENT DOCUMENTS

| | | | |
|---|---|---|---|
| 116997 | 7/1984 | Japan | 307/353 |
| 194700 | 8/1986 | Japan | 307/353 |
| 0144299 | 6/1989 | Japan | 307/353 |
| 0154395 | 6/1990 | Japan | 307/353 |
| 4-324197 | 11/1992 | Japan | 307/353 |

Primary Examiner—Margaret R. Wambach
Attorney, Agent, or Firm—Robert L. King

[57] ABSTRACT

A sampling circuit (10, 10') selectively samples, stores and provides multiple output signals with a single amplifier (30). A sampling capacitor (20, 28) is used for each input channel. In order to minimize crosstalk between the multiple channels, each sampling capacitor is selectively electrically isolated from an input of the single amplifier by a switch (18, 25). Each sampling capacitor is further selectively electrically isolated from an output of the single amplifier by another switch (19, 26). A switch structure (50, 52, 54) which is guard ring protected may be used at the input of each channel to further minimize crosstalk errors.

20 Claims, 6 Drawing Sheets

MULTIPLE CHANNEL SAMPLING CIRCUIT HAVING MINIMIZED CROSSTALK INTERFERENCE

FIELD OF THE INVENTION

The present invention generally relates to switched capacitor circuits, and more particularly, to data sampling circuitry using switched capacitor technology.

BACKGROUND OF THE INVENTION

Sampling or sample-and-hold circuits are commonly used in semiconductor products. In general, sampling circuits capture and store a voltage input signal and provide a voltage output signal which is equal to or proportional to the input signal. In many applications, a plurality of input signals need to be sampled and held. Others have used a sample-and-hold circuit for each input signal with the disadvantage of having to implement a significant amount of additional circuitry.

Known multiple channel circuits are susceptible to an error commonly referred to as "cross-talk" error. Cross-talk is an interaction between signals or circuits of different channels. In one form, cross-talk is an interaction between a channel which is not in use and a channel which is in use.

A known circuit which helps reduce the cost of multiple sample-and-hold circuits uses a multiplexor circuit in conjunction with a single amplifier. In one form of this technique, a plurality of transistor switches couples an analog input signal to a single storage capacitor which is commonly utilized among multiple input channels. One transistor switch is provided for each separate analog signal and within the sample-and-hold circuit. A performance disadvantage with providing a commonly utilized storage capacitor connected to each transistor switch is the existence of a time delay required to change a voltage associated with each separate analog signal at the commonly utilized storage capacitor. That is, when the voltages of the separate analog input signals are substantially different, parasitic resistances and capacitances associated with input circuits external to the sample-and-hold circuit cause an unwanted time delay. The unwanted time delay limits either the accuracy or the operating speed of this known multichannel sample-and-hold circuit.

Yet another known multiple channel system multiplexes a plurality of channel inputs to a single A/D converter. Many applications require a resistor/capacitor (RC) filter network at the input of each analog input. Frequently, the impedance of such a filter network is greater than ten thousand ohms. A disadvantage with a multiplexed A/D converter is the presence of an error commonly referred to as "cross-talk" between the channels. Cross-talk can be created as a result of the A/D converter having an input coupled to a capacitive node. As a result of the capacitance, there is charge sharing between a previous data sample and a current data sample. The charge sharing causes a previously selected input signal to affect a selected input signal's value. It is desired to operate the system at higher frequencies, but because the time constant of the RC filter network is significant, there is not enough time to correct the charge sharing error between two successive data samples. Therefore, unless enough time is allowed for the capacitive input node to charge completely, cross-talk errors are usually present.

In a multiple channel circuit, if a semiconductor junction of an input protection structure or an analog switch which is not in use is forward biased to be substantially conductive, charge carriers will be injected into an underlying semiconductor region of the circuit. If these carriers are "collected" by the semiconductor junctions of the circuitry of a channel in use, the carriers which comprise a current will produce a voltage difference across the impedance of the circuitry of that channel. If this voltage difference is present when a channel is sampling, the voltage difference will produce cross-talk error in the sample.

SUMMARY OF THE INVENTION

In accordance with one form of the invention, there is provided a multiple channel sampling circuit having minimized crosstalk interference. In one form, a plurality of input stages is provided wherein each input stage has three switches and a sampling capacitor. A first switch has a first terminal for receiving a selected one of a plurality of input signals, and a second terminal. The sampling capacitor has a first electrode coupled to the second terminal of the first switch, and has a second electrode. A second switch has a first terminal coupled to the second electrode of the sampling capacitor, and has a second terminal. A third switch has a first terminal coupled to the first electrode of the sampling capacitor, and has a second terminal coupled to an output of the multiple channel sampling circuit. The multiple channel sampling circuit further has an amplifier and fourth and fifth switches. The amplifier has a first input coupled to the second terminal of the second switch of each of the plurality of input stages, a second input for receiving a voltage reference, and an output. The fourth switch has a first terminal coupled to the first input of the amplifier, and has a second terminal coupled to the output of the amplifier. The fifth switch has a first terminal coupled to the output of the amplifier, and has a second terminal coupled to the second terminal of the third switch for providing the output of the multiple channel sampling circuit.

In another form, a multiple channel sampling circuit has a plurality of input stages. Each input stage comprises a first switch having a first terminal for receiving a selected one of a plurality of input signals, and a second terminal. A sampling capacitor having a first electrode is coupled to the second terminal of the first switch, and has a second electrode. A second switch has a first terminal coupled to the second electrode of the sampling capacitor, and has a second terminal. A third switch has a first terminal coupled to the first electrode of the sampling capacitor, and has a second terminal. An amplifier has a first input coupled to the second terminal of the second switch of each of the plurality of input stages, a second input for receiving a voltage reference, and an output coupled to the second terminal of the third switch of each of the plurality of input stages. A fourth switch has a first terminal coupled to the first input of the amplifier, and has a second terminal coupled to the output of the amplifier. A fifth switch has a first terminal coupled to the output of the amplifier, and has a second terminal for providing an output of the multiple channel sampling circuit.

In other forms, methods for sampling a plurality of input signals are provided.

These and other features, and advantages, will be more clearly understood from the following detailed description taken in conjunction with the accompanying drawings. It is important to point out that there may be other embodiments of the present invention which are not specifically illustrated.

DETAILED DESCRIPTION OF A PREFERRED EMBODIMENT

Figure 1:
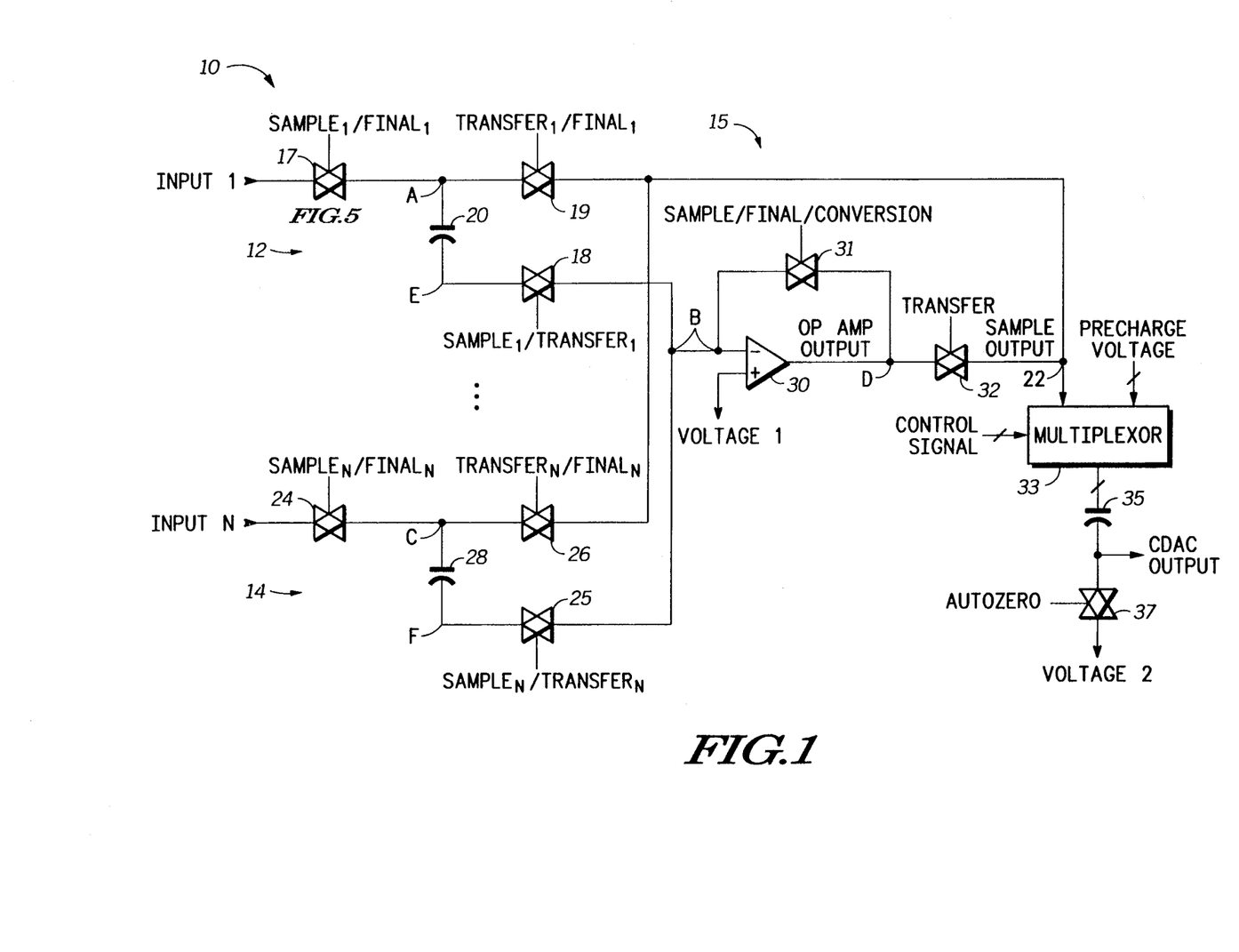
FIG. 1 illustrates in partial schematic form a multiple channel sampling circuit in accordance with the present invention.

Illustrated in FIG. 1 is a multiple channel sampling circuit 10 having N input stages 12 and 14, where N is an integer, and an output stage 15. Input stage 12 has transistor switches 17, 18 and 19 and a sampling capacitor 20. Switch 17 has a first terminal for receiving a first input signal, labeled "Input 1", and a second terminal connected to a first electrode of capacitor 20 at a node labeled "A." A second electrode of capacitor 20 is connected to a first terminal of switch 18 at a node labeled "E". A second terminal of switch 18 is connected to a node labeled "B." A first terminal of switch 19 is connected to the second terminal of switch 17 and to the first electrode of capacitor 20 at node A. Switch 19 has a second terminal connected to the output of sampling circuit 10, labeled "Sample Output", at a node 22. Each of switches 17–19 has a control terminal.

Input stage 14 has transistor switches 24, 25 and 26 and a sampling capacitor 28. Switch 24 has a first terminal for receiving an Nth input signal, labeled "Input N", and has a second terminal connected to a first electrode of capacitor 28 at a node labeled "C." A second electrode of capacitor 28 is connected to a first terminal of switch 25 at a node labeled "F". A second terminal of switch 25 is connected to node B. A first terminal of switch 26 is connected to the second terminal of switch 24 and to the first electrode of capacitor 28 at node C. Switch 26 has a second terminal connected to the output of sampling circuit 10 at node 22. Each of switches 24–26 also has a control terminal.

Output stage 15 has an operational amplifier 30 having a first or negative input connected to node B, a second or positive input connected to a first fixed voltage terminal, labeled "Voltage 1", and an output labeled "Op Amp Output" connected to a node labeled "D." A feedback switch 31 has a first terminal connected to the negative input of operational amplifier 30 at node B, a second terminal connected to the output of operational amplifier 30 at node D, and a control terminal. A first terminal of a switch 32 is connected to the output of operational amplifier 30. Switch 32 has a second terminal connected to node 22 which is the sample circuit output labeled "Sample Output," and also has a control terminal. In one form, sampling circuit 10 may have an output load in the form of a capacitive digital-to-analog converter (CDAC). In the illustrated form, a multiplexor 33 has a first input connected to the node 22, a second input for receiving an input labeled "Precharge Voltage," an output, and a Control Signal which represents a plurality of signals. It should be noted that multiplexor 33 would be implemented as a plurality of switches (not shown) and would have a plurality of outputs. The equivalent output of multiplexor 33 is connected to a first electrode of a DAC capacitance 35, which is illustrated as a single capacitor but which represents the collective capacitance of a capacitive DAC. DAC capacitance 35 has a second electrode which provides an output labeled "CDAC Output" and which is connected to a first terminal of a switch 37. It should be noted that although DAC capacitance 35 is represented as a single capacitor, the capacitance of a DAC is actually a plurality of discrete capacitors but represented as a single capacitor for convenience of illustration. Accordingly, it should be noted that the Precharge Voltage signal is actually a plurality of precharge voltages which are used to charge DAC capacitance 35. A second terminal of switch 37 is connected to a second voltage terminal, labeled "Voltage 2." Switch 37 has a control terminal for receiving a control signal labeled "Autozero."

Figure 2:
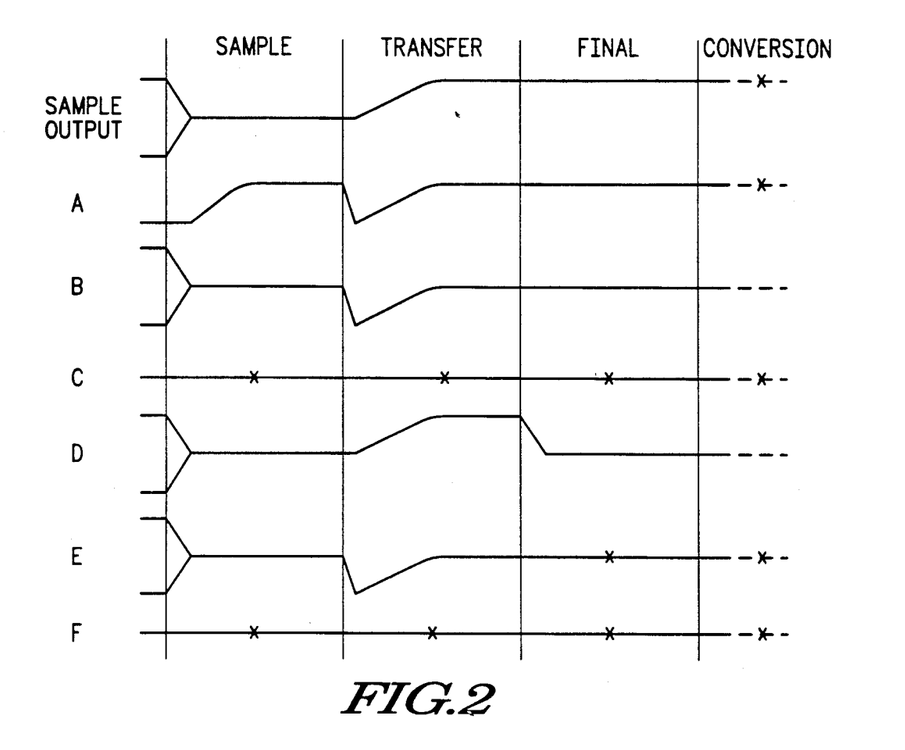
FIG. 2 illustrates in timing diagram form signal waveforms associated with the circuit of FIG. 1.

In operation, sampling circuit 10 functions by having three distinct successive time periods of operation. As illustrated in FIG. 2 the three time periods are a Sample time period, a Transfer time period, and a Final time period, which precede a Conversion time period. During the Conversion time period, an analog signal value which is delivered to DAC capacitance 35 is converted to a digital representation. It should be noted that the Final time period may be programmable in length by a user of the circuit and may vary as taught in U.S. Pat. No. 5,081,454, assigned to the assignee hereof and incorporated by reference. In addition, the Sample time period and/or the Transfer time period may be made programmable by a user of the circuit 10 so that the time length of each or both periods may vary.

FIG. 2 illustrates waveforms for the Output of operational amplifier 30 and signal conditions at nodes A thru F during the three successive time periods. It should be well understood that sampling circuit 10 is illustrated assuming that N-channel transistor switches are implemented, but transistors having other conductivities may be used in an analogous manner. While the circuit of the preferred embodiment is susceptible primarily to input voltages greater in magnitude than Voltage 1, it should be understood that implementations of the present invention utilizing other types of transistors and conductivities would have an analogous susceptibility to input signals having a magnitude within a different range of voltages. If signals having an opposite polarity, with respect to Voltage 1, than those described herein are utilized, then the waveforms of the signals illustrated in FIG. 2 and elsewhere would be opposite in voltage direction from that which is illustrated. Also it should be understood that the waveforms of FIG. 2 are each representative of one signal value within a range of signal values. The actual magnitude of each waveform may depend, in part, upon the values of power supply voltages and input signals.

Figure 3:
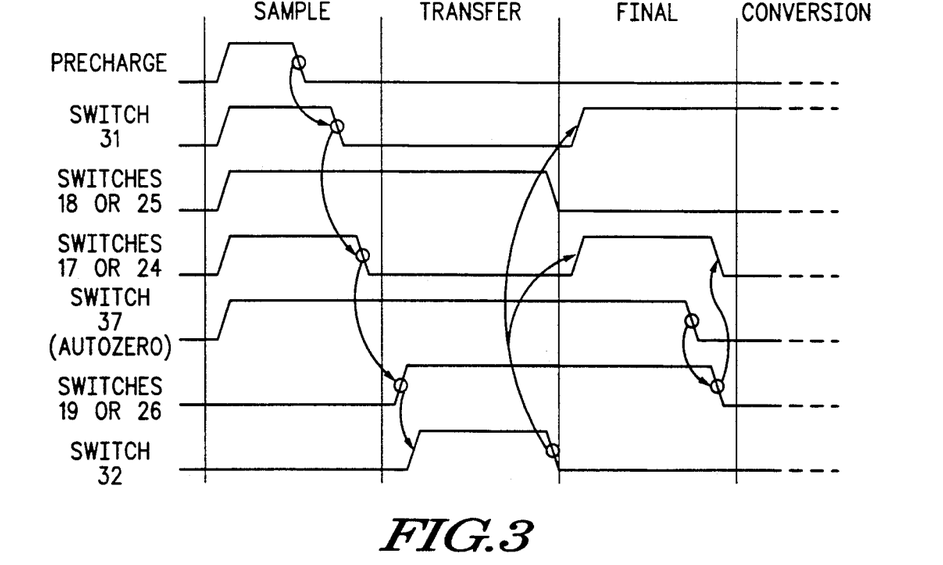
FIG. 3 illustrate in timing diagram form control signals associated with switches illustrated in the circuit of FIG. 1.

Additionally, FIG. 3 illustrates waveforms associated with the control signals which make each of switches 17, 18, 19, 24, 25, 26, 31, 32 and 37 conductive and nonconductive. Since each of the switches, in the illustrated form, is considered to be made conductive when a high level waveform occurs and nonconductive when a low level waveform occurs, FIG. 3 also illustrates which switches of circuit 10 are conductive or active during each of the time periods or modes of operation.

In the example of FIG. 2, only the Input 1 signal is being sampled regardless of the signal value at each of the remaining (N−1) inputs. For purposes of readily understanding the operation of sampling circuit 10, the essential or approximate time periods during which each switch is conductive is stated above each switch's control electrode in FIG. 1. For example, switch 17 is conductive during each of the sample and the final time periods whereas switch 32 is conductive only during the transfer time period. Again note that only one input stage is operative at any one point in time. Therefore, during the sample time period, only one of switches 17 or 24 is conductive although each of input stages 12 or 14 operates in the same manner. Assuming that input stage 12 is selected for sampling at the exclusion of the other (N−1) input stages, then only switches 17, 18 and 31 are conductive during the Sample time period of FIG. 2. During the Sample time period, the output voltage at node 22 is precharged to a predetermined voltage level which is intermediate to the analog signal range used to power sampling circuit 10. In addition, the plurality of output nodes between multiplexor 33 and DAC capacitance 35 are also charged to the same predetermined voltage level. In the illustrated form, Voltage 1 is at the intermediate analog signal range. For example, in a five volt power supply system, an appropriate intermediate precharge voltage for the output at node 22 would be two and one-half volts. However, it should be well understood that a range of voltage values may be used. As the input signal having a voltage potential greater than Voltage 1 is coupled to capacitor 20 during the Sample time period, node A is charged from a low voltage level to a high voltage level as illustrated in FIG. 2. Concurrently, node B is forced by operational amplifier 30 to the Voltage 1 value which preferably is a voltage having a constant value which is intermediate to a constant power supply potential and ground. The voltage at node C within input portion 14 is irrelevant, as noted in FIG. 2 by an "X" during all three successive time periods. Switch 31 functions to place operational amplifier 30 in a unity gain feedback configuration, and during the Sample time period forces nodes B and D to the same voltage potential as Voltage 1, except for a small offset error, $V_{OS}$. Switch 18 functions to directly couple the intermediate voltage level at node B to node E so that node E assumes substantially the same voltage as node B during the Sample time period. The voltage at node F within input portion 14 is also irrelevant, as noted in FIG. 2 by an "X" during all three successive time periods. Therefore, during the Sample time period, the Input 1 signal is charged onto capacitor 20 while the voltage at the first input and the output of operational amplifier are forced to be virtually the same, except for a small offset voltage. The voltage on capacitor 20 is actually the voltage potential of Input 1 minus both Voltage 1 and $V_{OS}$. It should be noted from FIG. 3 that the timing of the switching action of the Precharge and autozero activity and switches 31, 17 and 18 during the Sample period is important. In particular, it is important that the Precharge signals to the DAC capacitance 35 become inactive before switch 31 becomes nonconductive. Furthermore, it is important that switch 31 becomes nonconductive before switch 17 becomes nonconductive. This sequence of switching minimizes the charge injection onto the sample capacitor 20 as well as minimizing disturbance of the filter network (not shown) at the input.

At the beginning of the Transfer time period, switch 17 is nonconductive and switch 19 becomes conductive after which switch 32 becomes conductive. During the Transfer time period, only switches 18, 19, 32 and 37 are conductive. The Sample Output at node 22 is coupled to DAC capacitance 35 by multiplexor 33. DAC capacitance 35 has previously been precharged to the Precharge Voltage. Since a capacitor's voltage cannot be instantaneously changed by a finite impedance, node A is forced to virtually the Precharge Voltage, whereupon nodes E and B are displaced negatively by capacitor 20. As a result of this negative transition of the input signal, the output of operational amplifier 30 at node D begins slewing positively and drives node 22 to the voltage that was sampled at Input 1 by capacitor 20. After reaching equilibrium, nodes E and B will be at the sum of Voltage 1 and the offset voltage, $V_{OS}$, of operational amplifier 30. Therefore, nodes A, 22 and D will each attain a voltage potential substantially equal to the voltage at Input 1.

During the Final time period, switch 32 must become nonconductive before switches 17 and 31 become conductive while switches 19, and 37 remain conductive. All other switches remain nonconductive. Thus the DAC capacitance 35 is directly coupled to and charged by the Input 1 signal. As a result of switch 18 being nonconductive, the potentials of node A and the Sample Output of circuit 10 at node 22 remain the same during the Final time period. Any voltage variation at node E is irrelevant as noted by an "X" in FIG. 2. The timing of the switching transition of switches 17, 37 and 19 is important as noted in FIG. 3. In particular, it is important that switch 37 becomes nonconductive before switch 19 becomes nonconductive, after which switch 17 can become nonconductive. By removing the Voltage 2 potential from the lower electrode of the DAC capacitance 35 via switch 37 before switch 19 and subsequently 17 are made nonconductive, error charge is not placed in DAC capacitance 35. By making switch 31 conductive after switch 18 and switch 32 are nonconductive, operational amplifier 30 is placed in a low noise state.

It should be noted that conventional voltage error compensation techniques may be used to cancel charge which is coupled onto nodes B and D of sampling circuit 10 by the control signal of switch 31. Such compensation is not shown in FIG. 1 but should be understood to be desired to improve circuit performance.

Subsequent to the Final time period, a conversion of the sampling circuit output at node 22 to a digital representation may occur. During the Conversion time period, switch 31 is conductive and all other switches are nonconductive.

Each of the N input sections of sampling circuit 10 has a separate sampling capacitor associated with the section, such as capacitors 20 and 28. Additionally, each of the N input sections has a switch, such as switch 18, which couples an associated sampling capacitor to node B or the first input of operational amplifier 30 only during the Sample and Transfer time periods. The first input of operational amplifier 30 functions as a summing junction input during the Sample time period only. The presence of each of switch 18 and switch 25 is very important because the negative input of operational amplifier 30 is momentarily displaced in voltage when a sampling capacitor is connected to the operational amplifier output and the precharged DAC capacitance 35 by multiplexor 33. If switches 18 and 25 were not present but the circuit path containing those switches existed, then depending upon the charge stored on a sampling capacitor of another input section, the displacement in voltage at the first input of operational amplifier 30 may force the semiconductor junction of the nonconductive transistor switches more than a semiconductor junction threshold turn-on voltage potential beyond a supply potential which could make parasitic bipolar devices (not shown in FIG. 1) of the nonconductive switches conductive. A resulting charge redistribution could introduce significant errors on one or more sampling capacitors of the input portions. In sampling circuit 10, the switches associated with each input signal are only activated when that input signal or channel is selected. Therefore, the sampling capacitor of each input section is guaranteed to retain a previous sample voltage, except for possible leakage effects. Therefore, if any change has occurred in an input section's sampled voltage, a small charge redistribution will occur when interpolating between a previous sample value and a current sample value. However, due to the small size of capacitance of the sampling capacitor relative to an external filter network which provides each of the Input signals, only a small error would result even if a full-scale change in input sample voltage occurred between two successive input sample values. Assuming that an input section was "oversampled" as compared with the bandwidth of the coupled external filter network, the error introduced as a result of charge redistribution is considerably smaller than the error for a full-scale change. This error could be considered to be similar to a phase error or time delay error in the signal. However, switches 18 and 25 each function to prevent any interaction between the input sections which would result in cross-talk error.

It should be noted that the timing of the control of the switches and the matching of switch impedances is very important to avoid charge injection by capacitive coupling of the control signals and to also provide adequate power supply noise rejection. However, conventional techniques may be used to accomplish these goals and will not be discussed herein. It should also be noted that although the offset voltage is stored on and compensated by the sample capacitor 20 or 28, conventional offset voltage compensation techniques may be used to improve the performance of operational amplifier 30 and to avoid introducing an output error as a result of operational amplifier offset voltage.

Figures 4, 5:
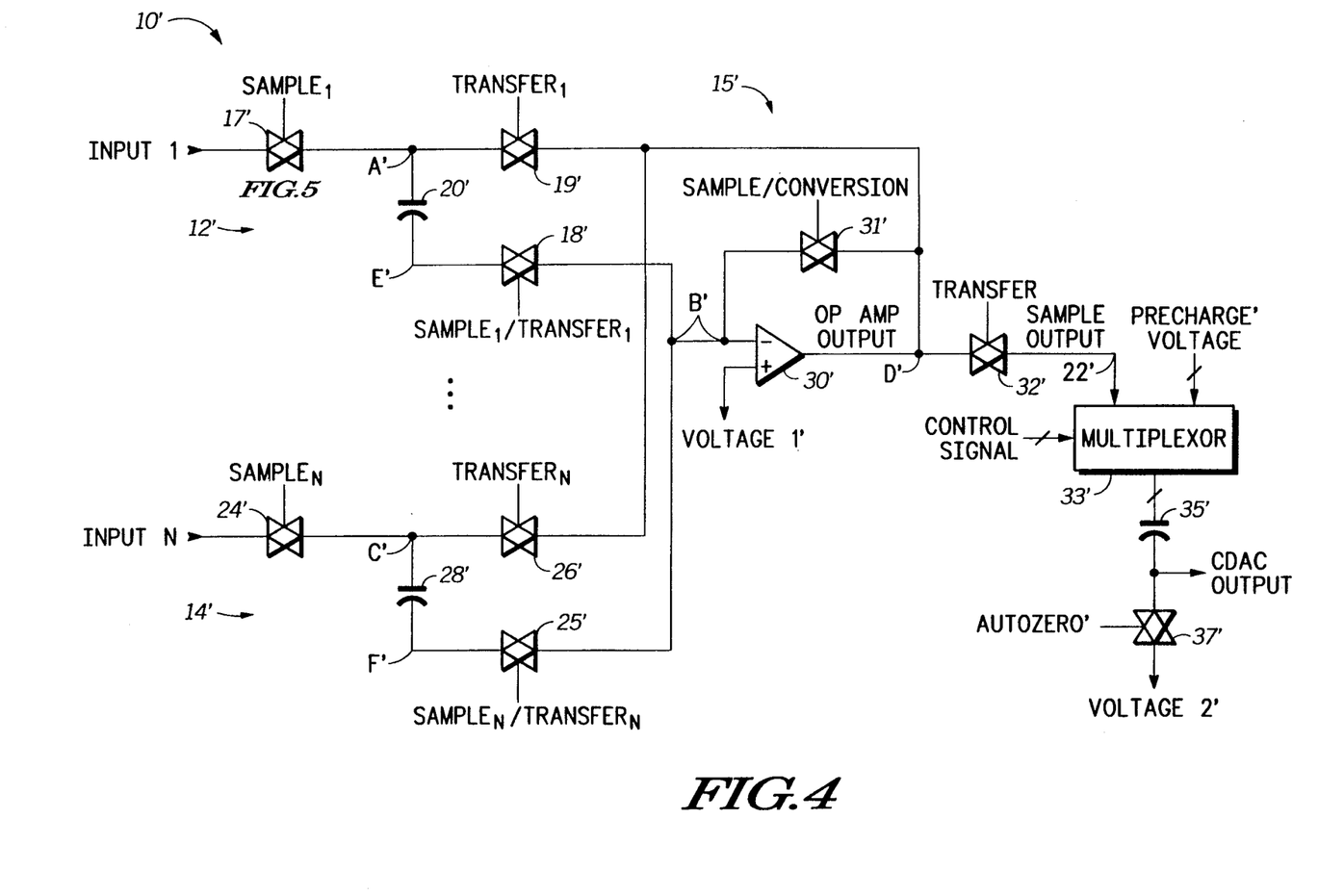
FIG. 4 illustrates in partial schematic form another form of the multiple channel sampling circuit in accordance with the present invention.
FIG. 5 illustrates in timing diagram form signal waveforms associated with the circuit of FIG. 4.
Figure 5:
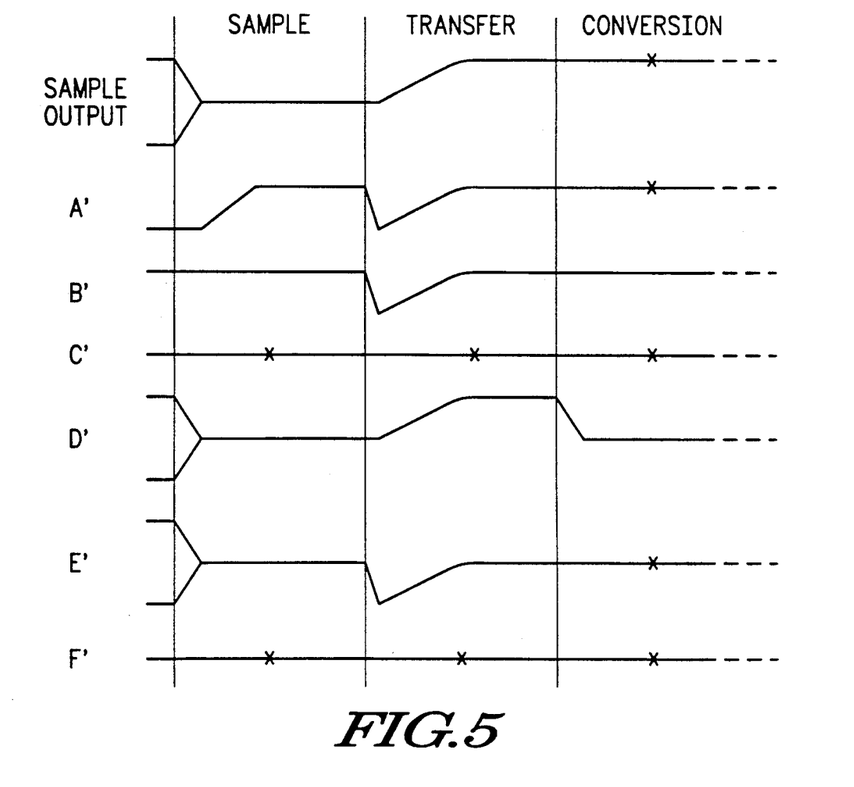

Illustrated in FIG. 4 is another form of the present invention. For purposes of readily comparing sampling circuit 10 with FIG. 4, analogous elements will be similarly numbered, but with a prime. The nodes A thru F will be similarly labeled but with a prime. The modification of sampling circuit 10' of FIG. 4 which is different from sampling circuit 10 is associated with the connection of the second terminals of switches 19' and 26' directly to the output of operational amplifier 30' at node D' and to the first terminal of switch 32'. Additionally, only two successive time periods are required for sampling circuit 10' prior to an output or conversion time. As illustrated in FIG. 5, only a Sample time period and a Transfer time period are required before a conversion of the output of sampling circuit 10' may be started. During the Sample time period, assume that input section 12' is selected for sampling of the Input 1 signal to the exclusion of the other (N−1) input sections. Therefore, switches 17', 18' and 31' are conductive and all other switches are nonconductive. In this circuit configuration, Node B' is at the Voltage 1' potential plus a small offset voltage of operational amplifier 30' which is equal to a mid-range voltage value between two analog voltage potentials. Switch 18' places node E' at this potential also. Node D' assumes the mid-range voltage potential regardless of whether node D' was previously at a higher or a lower voltage potential. During the Sample time period, the Sample output at node 22' is precharged to substantially the same mid-range voltage value as a result of switching operation associated with DAC capacitance 35' and multiplexor 33'. During the Sample time period node A' charges to the Input 1 signal value. Switch 31' functions to maintain the output and the first input of operational amplifier 30' at approximately the same voltage potential as Voltage 1'. The values of the voltages at nodes C' and F' of input section 14' are irrelevant as noted by an "X" in FIG. 5.

During the Transfer time period, switches 18', 19' and 32' are conductive and all other switches except 37' are nonconductive. The switching action causes a voltage translation to occur across capacitor 20'. Because the voltage across sampling capacitor 20' cannot change instantaneously, the voltage at each of nodes B', E' and A' drops initially, for this example, before returning to the original voltage level. The output of operational amplifier 30' at node D' is translated to the voltage level of the sampled Input 1 signal. The values of the voltages at nodes C' and F' of input section 14' during the Sample time period are irrelevant as noted by an "X" in FIG. 5. At this point in time, the sampled voltage of the Input 1 signal has been provided as an output of operational amplifier 30'. Before the Conversion time period can begin, operational amplifier 30' must be disconnected from the DAC capacitance 35'. During the Conversion time period the output signal is converted using the DAC capacitance 35'.

Figure 6:
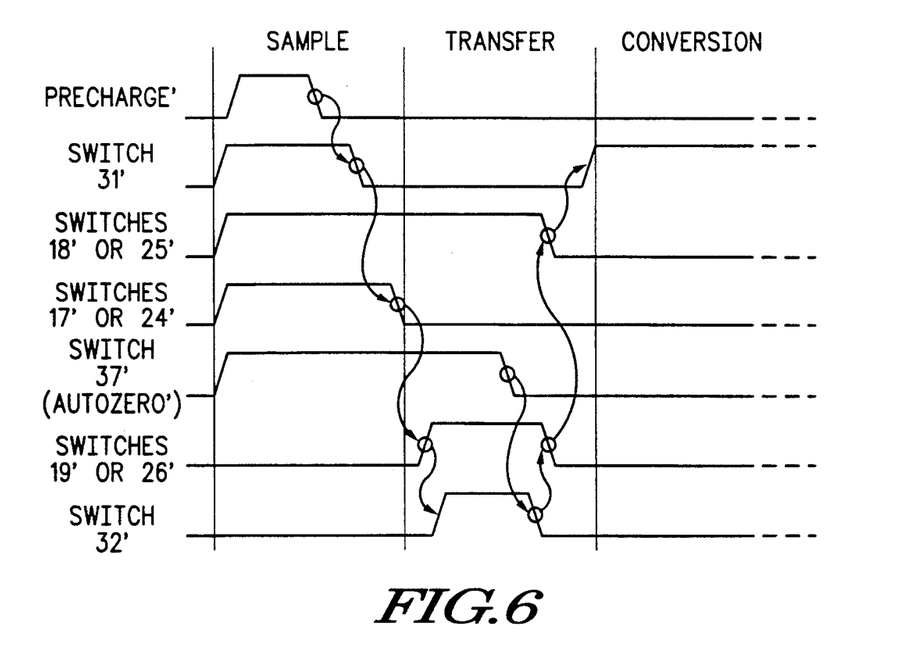
FIG. 6 illustrates in timing diagram form control signals associated with switches illustrated in the circuit of FIG. 4.

Illustrated in FIG. 6 in graphical form is an example of the control signals for the switches of circuit 10' during the Sample, Transfer and Conversion time periods. It should be noted from FIG. 6 that the timing of the Precharge action in multiplexor 33' and the switching action of switches 31' and 17' during the Sample period is important. In particular, it is important that the Precharge signals to the DAC capacitance 35' become inactive before switch 31' becomes nonconductive. Furthermore, it is important that switch 31' becomes nonconductive before switch 17' becomes nonconductive. Subsequent to switch 17' becoming nonconductive, switch 19' becomes conductive at the beginning of the Transfer time period, after which switch 32' becomes conductive. This sequence of switching minimizes the charge injection onto the sample capacitor 20' as well as minimizing disturbance of the filter network (not shown) at the input.

During the Transfer time period, only switches 18', 19', 32' and 37' are conductive. The Sample Output at node 22' is coupled to DAC capacitance 35' by multiplexor 33'. DAC capacitance 35' has previously been precharged to the Precharge' Voltage. Since a capacitor's voltage cannot be instantaneously changed by a finite impedance, node A' is forced to virtually the Precharge' Voltage, whereupon nodes E' and B' are displaced negatively by capacitor 20'. As a result of this negative transition of the input signal, the output of operational amplifier 30' at node D' begins slewing positively and drives node 22' to the voltage that was sampled at Input 1 by capacitor 20'. After reaching equilibrium, nodes E' and B' will be at the sum of Voltage 1' and the offset voltage, $V_{OS}$, of operational amplifier 30'. Therefore, nodes A', 22' and D' will each attain a voltage potential substantially equal to the voltage at Input 1.

In the illustrated form, to conclude the Transfer time period, the timing of the switching transition of switches 37', 32', 19', 18' and 31' is important as noted in FIG. 6. In particular, it is important that switch 37' becomes nonconductive before switch 32' becomes nonconductive, after which switch 19' can become nonconductive. After switch 19' is nonconductive, switch 18' becomes nonconductive, after which switch 31' can become conductive. By removing the Voltage 2' potential from the lower electrode of the DAC capacitance 35' via switch 37' before switch 19' and subsequently 17' are made nonconductive, error charge is not placed in DAC capacitance 35'. By making switch 31' conductive after switch 18' and switch 32' are nonconductive, operational amplifier 30' is placed in a low noise state.

As with sampling circuit 10, the use of the switches 18' and 25' provides an important function in minimizing crosstalk interference between the N input sections or channels. Although N different capacitors are provided for sampling each input onto a unique and separate capacitor, the switches 18' and 25' function to isolate the charge on each capacitor from the input of operational amplifier 30' when the associated channel is not in use. Therefore, there can be no significant residual charge coupling from one sampling capacitor to another as would be the result of two capacitors being simultaneously coupled to the first input of operational amplifier 30' at node B'. The independence of charge sharing between the multiple channels also permits the sampling circuit to be operated at a higher frequency without creating a resulting error component.

Another aspect of the present invention which further eliminates a potential source of error is the implementation and physical device layout of switches 17 and 24 of FIG. 1 and switches 17' and 24' of FIG. 4. When the switches of the present invention are implemented as MOS transistors, each MOS transistor may have an associated parasitic bipolar transistor associated therewith. Such parasitic bipolar transistors can have multiple collector electrodes which may couple to other channels of the sampling circuit as well as to other portions (not shown) of an integrated circuit which would contain the sampling circuit. In the present embodiment, if the input signal voltage presented to any unselected channel is below the substrate or ground potential of circuit ground which circuit 10 is using, the parasitic bipolar transistor may become conductive. When conductive, a current appears in other channels such that any impedance in a channel current path could cause a voltage error in connection with the sampling of the selected channel. To prevent this possible circuit condition, the input switch of each of the input sections of sampling circuits 10 and 10' may be specifically implemented to avoid this type of crosstalk interference.

Figure 7:
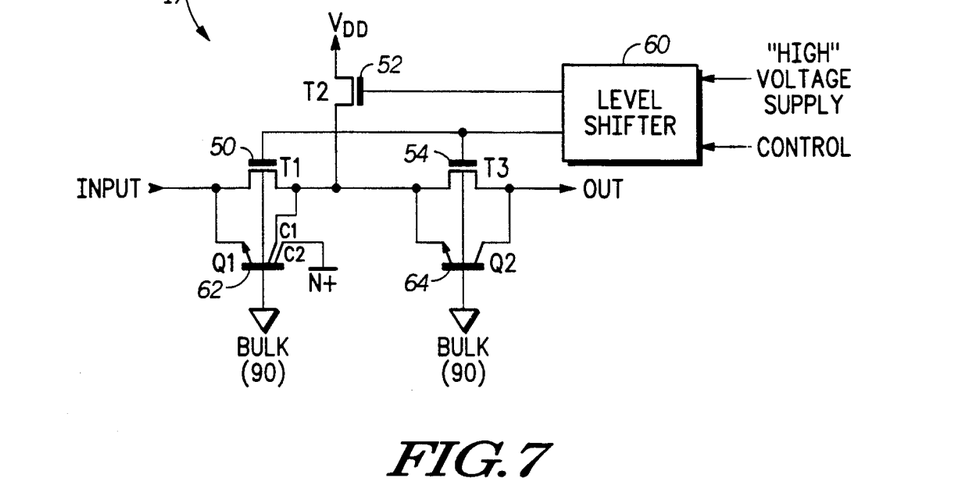
FIG. 7 illustrates in schematic form an input switch of the sampling circuit of each of FIG. 1 and FIG. 4 in accordance with the present invention.

Illustrated in FIG. 7 is a schematic of a preferred embodiment of switch 17 or switch 17' previously described. Switches 24 and 24' should, in a preferred form, also be implemented with the same switch structure. Switch 17 is implemented with three transistors, labeled "T1", "T2" and "T3". In the illustrated form, the three transistors have the same conductivity type and are assumed to be N-channel devices, although other types of analog switches may be used. Transistor T1 is represented as transistor 50 which has a first current electrode connected to the Input signal, such as Input 1. Transistor T2 is represented as transistor 52 and transistor T3 is represented as transistor 54. Transistor 50 has a second current electrode connected to a first current electrode of each of transistors 52 and 54. A second current electrode of transistor 52 is connected to a positive power supply voltage terminal for receiving a power supply voltage labeled "$V_{DD}$". A second current electrode of transistor 54 provides an output terminal of switch 17. A level shifter circuit 60 has a first input for receiving a voltage labeled "'High' Voltage Supply". The 'High' Voltage Supply is so labeled because the voltage is greater in voltage potential than VDD in order to allow the Input and Output voltage values conducted by switch 17' to vary fully between analog ground and VDD. A second input of level shifter 60 receives a Control signal provided by conventional control circuitry (not shown). Level shifter 60 has a first output for providing a first control signal to a gate or control electrode of transistor 52 and has a second output for providing a second control signal to a gate or control electrode of each of transistors 50 and 54. Also illustrated in FIG. 7 are two parasitic bipolar transistors labeled "Q1" and "Q2". A bipolar transistor Q1 is represented as transistor 62 and has an emitter connected to the first current electrode of transistor 50, a first collector, labeled "C1", connected to the second current electrode of transistor 50, and a second collector, labeled "C2" connected to an N+ guard ring. The base of bipolar transistor 62 is connected to the bulk material of transistor 50 which is connected to a substrate 90 of an associated integrated circuit. A bipolar transistor Q2 is represented as transistor 64 and has an emitter connected to the first current electrode of transistor 54, a collector connected to the second current electrode of transistor 54, and a base connected to the bulk material of transistor 54. Other parasitic collectors of transistors 62 and 64 are not illustrated.

Figure 8:
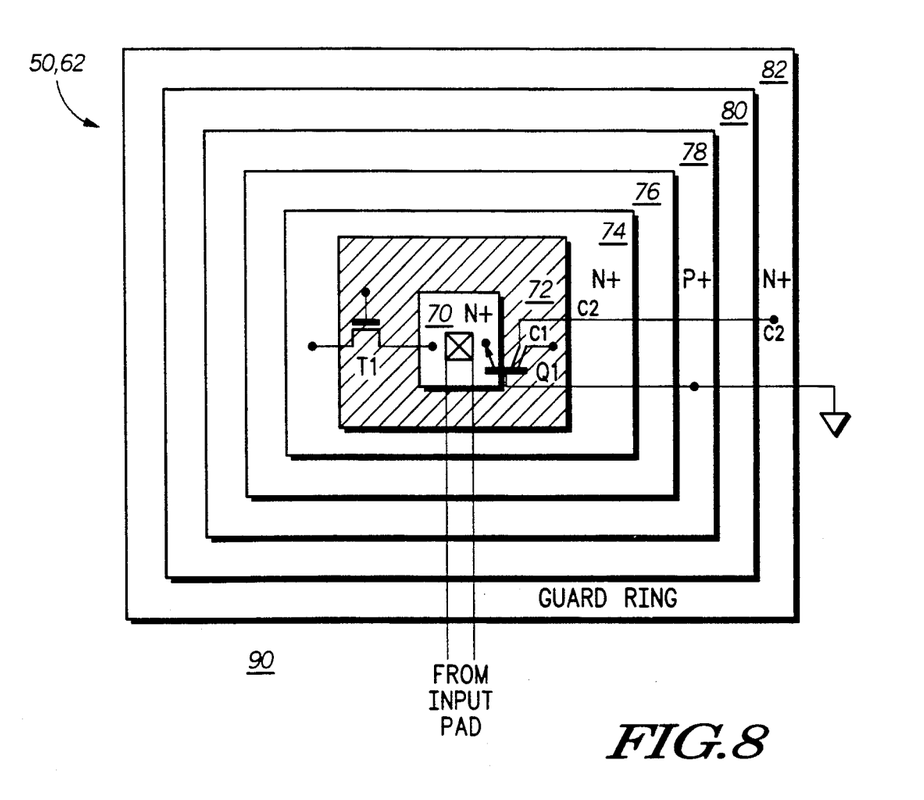
FIG. 8 illustrates in diagrammatic form a layout of one of the transistors of the input switch of FIG. 7.

Referring to FIG. 8, there is illustrated a layout of transistors 50 and 62 of FIG. 5. For ease of correspondence, the schematic of transistors 50 and 62 (T1 and Q1, respectively) are superimposed onto the layout. An N+ diffusion 70 is in the center of the layout and provides contact to the Input signal at an input pad (not shown). Diffusion 70 is a semiconductive material which functions as the emitter of bipolar transistor 62 and the first current electrode of transistor 50 (MOS transistor T1). Surrounding diffusion 70 is a region 72 of polycrystalline silicon which functions as the control electrode of transistor 50. Beneath region 72 is the bulk of the semiconductor structure which functions as the channel region of transistor 50 and the base of transistor 62. Transistors 50 and 62 are formed overlying the integrated circuit substrate 90. Surrounding region 72 is an N+ region 74 which functions as the first collector of transistor 62 and the second current electrode of transistor 50. A dielectric region 76 surrounds a periphery of region 74. A P+ diffusion region 78 surrounds dielectric region 76 and represents the actual contact to the integrated circuit substrate 90 and to the base of bipolar transistor 62. A dielectric region 80 surrounds diffusion region 78. An N+ conductive region 82 surrounds the periphery of the layout of transistor 50 and represents the second collector of bipolar transistor 62. Conductive region 82 functions as a guard ring to provide a current path for charge from region 82 to region 70. The guard ring protection which transistor 50 has prevents charge from being pulled from a nearby N+ diffusion (not shown) associated with another channel. Therefore, crosstalk between the multiple channels of sampling circuit 10 is virtually eliminated even if the input terminal has a lower potential than the circuit's substrate potential or analog ground. While switches 17, 17', 24, and 24' are illustrated as an N-channel only transistor implementation, it should be readily understood that a P-channel only transistor implementation or a CMOS (complementary metal oxide semiconductor) implementation may be used. Because both P-channel and N-channel transistors have associated parasitic bipolar devices, the above discussion applies analogously to other transistor implementations of switches 17, 17', 24 and 24' than the illustrated form. It should also be well understood that the present invention provides many advantages and has reduced crosstalk regardless of what type of switch is used to implement switches 17, 17', 24 and 24'. However, the disclosed compensated switch structure provides further immunity from crosstalk errors.

Figure 9:
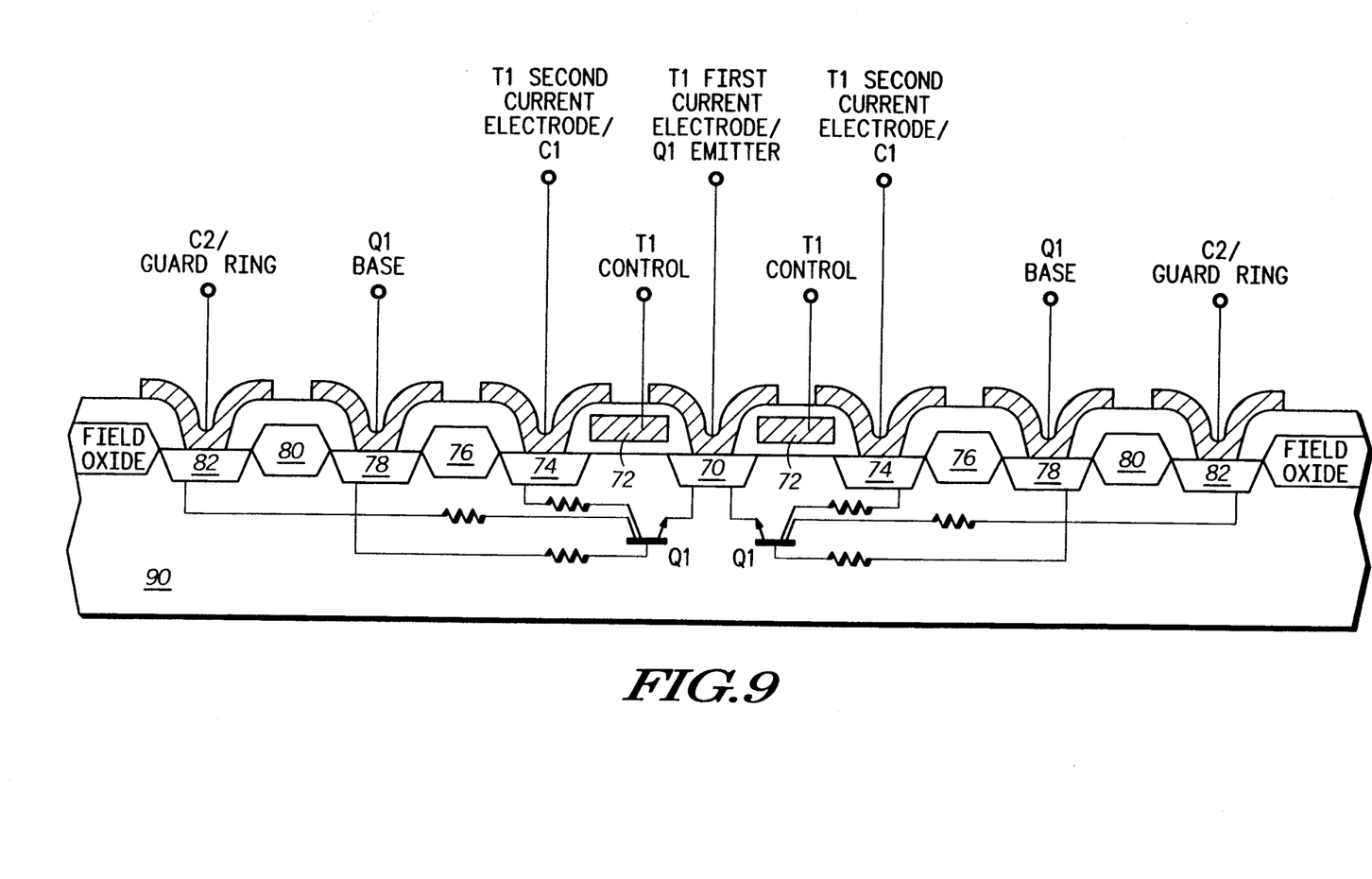
FIG. 9 illustrates in cross-sectional form the layout which is illustrated in FIG. 8.

Illustrated in FIG. 9 in cross-sectional form is transistor 50 and the associated bipolar transistor 62. Analogous elements from FIG. 8 are identically numbered for purposes of readily comparing FIGS. 8 and 9. In addition to illustrating the transistor regions discussed above in connection with FIG. 7, FIG. 8 also illustrates the physical connection with each region and identifies each electrode of transistor 50 and the parasitic bipolar transistor 62. The current paths between the base (substrate 90) of bipolar transistor 62 and other transistor regions are illustrated as resistive paths with individual resistors (not numbered). It can be readily seen that guard ring 82 encircles the entire transistor structure.

Thus it is apparent that there has been provided, in accordance with the present invention, a sampling circuit having multiple channels wherein crosstalk between the channels is significantly minimized. The inventive circuitry reduced loading of the input signal which drives the input of the sampling circuit. Many advantages of a multiple amplifier implementation of a multiple channel sampling circuit have been realized while only requiring a single amplifier. Although the invention has been described and illustrated with reference to specific embodiments thereof, it is not intended that the invention be limited to these illustrative embodiments. For example, one may utilize many different types of transistor switches for the switches. Although the present invention has been disclosed in the context of MOS semiconductors, other semiconductor technologies may be used. When specific conductivity types are provided, it should be well understood that reverse conductivities or both N and P conductivities may be implemented. Those skilled in the art will recognize that modifications and variations can be made without departing from the spirit of the invention. Therefore, it is intended that this invention encompass all such variations and modifications as fall within the scope of the appended claims.

We claim:

1. A multiple channel sampling circuit having minimized crosstalk interference, comprising:
    a plurality of input stages, each input stage comprising:
        a first switch having a first terminal for receiving a selected one of a plurality of input signals, and having a second terminal;
        a sampling capacitor having a first electrode coupled to the second terminal of the first switch, and having a second electrode;
        a second switch having a first terminal coupled to the second electrode of the sampling capacitor, and having a second terminal; and
        a third switch having a first terminal coupled to the first electrode of the sampling capacitor, and having a second terminal coupled to an output of the multiple channel sampling circuit;
    an amplifier having a first input coupled to the second terminal of the second switch of each of the plurality of input stages, a second input for receiving a voltage reference, and an output;
    a fourth switch having a first terminal coupled to the first input of the amplifier, and having a second terminal coupled to the output of the amplifier; and
    a fifth switch having a first terminal coupled to the output of the amplifier, and having a second terminal coupled to the second terminal of the third switch for providing the output of the multiple channel sampling circuit.

2. The multiple channel sampling circuit of claim 1 wherein each of the first, second, third, fourth and fifth switches has a control terminal, each switch being selectively conductive during at least one of three successive time periods, the first switch being conductive only during a first and a third of the three successive time periods, the second switch being conductive only during the first and a second of the three successive time periods, the third switch being conductive only during the second and third time periods of the three successive time periods, the fourth switch being conductive only during the first and third time periods of the three successive time periods, and the fifth switch being conductive only during the second time period.

3. The multiple channel sampling circuit of claim 2 wherein a third of the three successive time periods has a length which may be programmable by a user of the multiple channel sampling circuit.

4. The multiple channel sampling circuit of claim 1 wherein the first switch comprises:
    a first transistor having a first current electrode for receiving the selected one of the plurality of input signals, a control electrode for receiving a first control signal, and a second current electrode;
    a second transistor having a first current electrode for receiving a power supply voltage, a control electrode for receiving a second control signal which is asserted mutually exclusive of the first control signal, and a second current electrode coupled to the second current electrode of the first transistor; and
    a third transistor having a first current electrode coupled to the second current electrode of the first transistor, a second current electrode for connection to the first electrode of the sampling capacitor, and a control electrode coupled to the first control signal;

the first transistor having a conductive material completely surrounding a periphery of the first transistor for isolating the sampling capacitor from charge drain caused by parasitics associated with the first transistor.

5. The multiple channel sampling circuit of claim 4 wherein the first, second and third transistors are of the same conductivity type.

6. The multiple channel sampling circuit of claim 4 further comprising:

a level shifting circuit for providing the first and second control signals as non-overlapping signals.

7. The multiple channel sampling circuit of claim 1 wherein all of the second, third, fourth and fifth switches are one of: (1) complementary metal oxide semiconductor (CMOS) transmission gates; (2) N-channel transistor switches; or (3) P-channel transistor switches.

8. A multiple channel sampling circuit, comprising:

a plurality of input stages, each input stage comprising:

a first switch having a first terminal for receiving a selected one of a plurality of input signals, and having a second terminal;

a sampling capacitor having a first electrode coupled to the second terminal of the first switch, and having a second electrode;

a second switch having a first terminal coupled to the second electrode of the sampling capacitor, and having a second terminal; and a third switch having a first terminal coupled to the first electrode of the sampling capacitor, and having a second terminal;

an amplifier having a first input coupled to the second terminal of the second switch of each of the plurality of input stages, a second input for receiving a voltage reference, and an output coupled to the second terminal of the third switch of each of the plurality of input stages;

a fourth switch having a first terminal coupled to the first input of the amplifier, and having a second terminal coupled to the output of the amplifier; and a fifth switch having a first terminal coupled to the output of the amplifier, and having a second terminal for providing an output of the multiple channel sampling circuit.

9. The multiple channel sampling circuit of claim 8 wherein each of the first, second, third, fourth and fifth switches has a control terminal, each switch being selectively conductive during at least one of two successive time periods, the first switch being conductive only during a first of the two successive time periods, the second switch being conductive during each of the two successive time periods, the third switch being conductive only during a second time period of the two successive time periods, the fourth switch being conductive only during the first time period of the two successive time periods, and the fifth switch being conductive only during the second time period.

10. The multiple channel sampling circuit of claim 8 wherein the first switch comprises:

a first transistor having a first current electrode for receiving the selected one of the plurality of input signals, a control electrode for receiving a first control signal, and a second current electrode;

a second transistor having a first current electrode for receiving a power supply voltage, a control electrode for receiving a second control signal which is asserted mutually exclusive of the first control signal, and a second current electrode coupled to the second current electrode of the first transistor; and a third transistor having a first current electrode coupled to the second current electrode of the first transistor, a second current electrode for connection to the first electrode of the sampling capacitor, and a control electrode coupled to the first control signal;

the first transistor having a conductive material completely surrounding a periphery of the first transistor for isolating the sampling capacitor from charge drain caused by parasitics associated with the first transistor.

11. The multiple channel sampling circuit of claim 10 wherein the first, second and third transistors are of the same conductivity type.

12. The multiple channel sampling circuit of claim 10 further comprising:

a level shifting circuit for providing the first and second control signals as non-overlapping signals, the level shifting circuit utilizing a voltage having a magnitude greater than a voltage magnitude of the selected one of the plurality of input signals to permit a full value of the selected one of the plurality of input signals to be charge sampled onto the sampling capacitor.

13. The multiple channel sampling circuit of claim 8 wherein all of the second, third, fourth and fifth switches are one of: (1) complementary metal oxide semiconductor (CMOS) transmission gates; (2) N-channel transistor switches; or (3) P-channel transistor switches.

14. In a multiple channel sampling circuit, a method of selectively sampling each of a plurality of input signals, comprising the sequential steps of:

during a first time period:

coupling a first of the input signals to a first electrode of a sampling capacitor while coupling a second electrode of the sampling capacitor to a first input of an operational amplifier; and coupling a second input of the operational amplifier to a voltage terminal, and directly coupling an output of the operational amplifier to the first input;

during a second time period subsequent to the first time period:

coupling the first electrode of the sampling capacitor to the output of the operational amplifier and coupling the second electrode of the sampling capacitor to the first input of the operational amplifier; and maintaining the output of the operational amplifier de-coupled from the first input thereof;

the first input of the operational amplifier being electrically de-coupled from all other input signals during both the first and the second time periods; and subsequently sequentially repeating the steps of the first and second time periods for each remaining input signal of the plurality of input signals.

15. The method of claim 14 further comprising the step of:

user-programming the first time period from a first length of time to a different second length of time.

16. The method of claim 14 further comprising the step of:
user-programming the second time period from a first length of time to a different second length of time.

17. The method of claim 14 further comprising the step of:
during the second time period, charging an output signal provided by the output of the operational amplifier onto a load capacitor; and
during a third time period subsequent to the second time period, converting the output signal from an analog form to a digital form.

18. In a multiple channel sampling circuit, a method of selectively sampling each of a plurality of input signals, comprising the sequential steps of:
during a first time period:
coupling a first of the input signals to a first electrode of a sampling capacitor while coupling a second electrode of the sampling capacitor to a first input of an operational amplifier; and
coupling a second input of the operational amplifier to a voltage terminal, and coupling an output of the operational amplifier to the first input;
during a second time period subsequent to the first time period:
coupling the first electrode of the sampling capacitor to an output of the sampling circuit and to the output of the operational amplifier;
coupling the second electrode of the sampling capacitor to the first input of the operational amplifier; and
maintaining the output of the operational amplifier de-coupled from the first input thereof; and
during a third time period subsequent to the second time period:
coupling the first of the input signals to the output of the sampling circuit;
coupling the first input of the operational amplifier to the output of the operational amplifier; and
maintaining the second electrode of the sampling capacitor de-coupled from the first input of the operational amplifier;
the first input of the operational amplifier being electrically de-coupled from all other input signals during the first, second and third time periods; and
subsequently sequentially repeating the steps of the first, second and third time periods for each remaining input signal of the plurality of input signals.

19. The method of claim 18 further comprising the step of:
user-programming one of the first, second or third time periods from a first length of time to a different second length of time.

20. The method of claim 18 further comprising the step of:
during the second time period, charging an output signal provided by the output of the operational amplifier onto a load capacitor; and
during a fourth time period subsequent to the third time period, converting the output signal from an analog form to a digital form.

* * * * *